(12) United States Patent  
Medard et al.

(10) Patent No.: US 11,463,113 B2  
(45) Date of Patent: Oct. 4, 2022

(54) APPARATUS AND METHOD FOR MULTI-CODE DISTRIBUTED STORAGE

(71) Applicants: Massachusetts Institute of Technology, Cambridge, MA (US); Fraunhofer-Gesellschaft zur Förderung der angewandten Forschung e.V., Munich (DE)

(72) Inventors: Muriel Medard, Belmont, MA (US); Cornelius Hans Ulrich Hellge, Berlin (DE)

(73) Assignees: Massachusetts Institute of Technology, Cambridge, MA (US); Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 105 days.

(21) Appl. No.: 16/066,866

(22) PCT Filed: Jan. 27, 2017

(86) PCT No.: PCT/US2017/015302  
§ 371 (c)(1),  
(2) Date: Jun. 28, 2018

(87) PCT Pub. No.: WO2017/132487  
PCT Pub. Date: Aug. 3, 2017

(65) Prior Publication Data  
US 2020/0021314 A1 Jan. 16, 2020

Related U.S. Application Data

(60) Provisional application No. 62/288,791, filed on Jan. 29, 2016.

(51) Int. Cl.  
*H03M 7/02* (2006.01)  
*H03M 13/37* (2006.01)  
(Continued)

(52) U.S. Cl.  
CPC ..... *H03M 13/3769* (2013.01); *H03M 13/158* (2013.01); *H03M 13/1515* (2013.01);  
(Continued)

(58) Field of Classification Search  
CPC .... H03M 7/40; H03M 13/13; H03M 13/1515; H03M 7/00; H03M 13/09;  
(Continued)

(56) References Cited

U.S. PATENT DOCUMENTS

2007/0083803 A1* 4/2007 Chen ................ H03M 13/2789  
714/755  
2010/0322289 A1* 12/2010 Park ................ H03M 13/2963  
375/E1.002

(Continued)

FOREIGN PATENT DOCUMENTS

CN 101326728 A 12/2008  
CN 103636202 A 3/2014  
(Continued)

OTHER PUBLICATIONS

International Preliminary Report on Patentability dated Aug. 9, 2018 for PCT/US2017/015302; 10 Pages.

(Continued)

*Primary Examiner* — Linh V Nguyen  
(74) *Attorney, Agent, or Firm* — Daly, Crowley, Mofford & Durkee, LLP

(57) ABSTRACT

Systems and techniques described herein include jointly decoding coded data of different codes, including different coding algorithms, finite fields, and/or source blocks sizes. The techniques described herein can be used to improve existing distributed storage systems by allowing gradual data migration. The techniques can further be used within existing storage clients to allow application data to be stored within diverse different distributed storage systems.

16 Claims, 5 Drawing Sheets

(51) Int. Cl.
| | |
|---|---|
| *H03M 13/15* | (2006.01) |
| *H03M 13/25* | (2006.01) |
| *H03M 13/29* | (2006.01) |
| *H03M 13/47* | (2006.01) |
| *H03M 13/00* | (2006.01) |
| *H04L 67/1097* | (2022.01) |

(52) U.S. Cl.
CPC ..... *H03M 13/255* (2013.01); *H03M 13/2903* (2013.01); *H03M 13/2927* (2013.01); *H03M 13/3761* (2013.01); *H03M 13/47* (2013.01); *H03M 13/616* (2013.01); *H04L 67/1097* (2013.01)

(58) Field of Classification Search
CPC .......... H03M 13/1102; H03M 13/1111; H03M 7/4006; H03M 7/42; H03M 7/46; H03M 13/255; H03M 13/2906; H03M 13/3761; H03M 13/1108; H03M 7/30; H03M 7/6005; H03M 13/356; H03M 13/2957; H03M 13/116
USPC .................. 341/51, 94, 106, 107, 81–83, 87
See application file for complete search history.

(56) References Cited

U.S. PATENT DOCUMENTS

| | | | |
|---|---|---|---|
| 2011/0029846 A1 | 2/2011 | Stankovic et al. | |
| 2011/0035642 A1* | 2/2011 | Francillon | H04L 9/08 714/752 |
| 2011/0239091 A1* | 9/2011 | Toda | H03M 13/152 714/E11.041 |
| 2012/0131407 A1* | 5/2012 | Chiao | H03M 13/356 714/751 |
| 2012/0155531 A1* | 6/2012 | Yi | H03M 13/3707 375/240 |
| 2013/0061112 A1* | 3/2013 | Chen | H03M 13/114 714/E11.032 |
| 2013/0187798 A1* | 7/2013 | Marpe | H03M 7/607 341/67 |
| 2013/0198590 A1* | 8/2013 | Kim | H04L 1/0041 714/776 |
| 2013/0300591 A1* | 11/2013 | Marpe | H03M 7/4006 341/67 |
| 2015/0039964 A1* | 2/2015 | Fonseka | H03M 13/2909 714/756 |
| 2015/0304419 A1 | 10/2015 | Medard et al. | |
| 2016/0204873 A1* | 7/2016 | Perez De Aranda Alonso | H04L 27/3416 398/186 |

FOREIGN PATENT DOCUMENTS

| | | |
|---|---|---|
| CN | 103650462 A | 3/2014 |
| CN | 104364765 A | 2/2015 |
| CN | 104915450 A | 9/2015 |
| EP | 1 976 166 A1 | 10/2008 |
| EP | 1976166 A1 | 10/2008 |

OTHER PUBLICATIONS

Response (with Amended Claims) to European Rule 161 Communication dated Sep. 6, 2018 corresponding to European Application No. 17703911.2; Response filed on Feb. 28, 2019; 12 Pages.
Hellge, et al.; "Multi-Code Distributed Storage;" 2016 IEEE 9$^{th}$ International Conference on Cloud Computing; IEEE, Jun. 27, 2016; pp. 839-842; 4 pages.
Shah, et al.; "Interference Alignment in Regenerating Codes for Distributed Storage: Necessity and Code Constructions;" Arxiv. Org. Cornell University Library; May 10, 2010; 38 pages.
PCT International Search Report of the ISA for Int. Appl. No. PCT/2017/015302 dated May 3, 2017; 6 pages.
PCT Written Opinion of the ISA for Int. Appl. No. PCT/2017/015302 dated May 3, 2017; 10 pages.
European Decision to Grant dated Nov. 26, 2020 for European Application No. 17703911.2; 3 pages.
European Intention to Grant dated Jul. 21, 2020 for EP Application No. 17703911.2; 7 Pages.
Chinese Office Action (with English Translation) dated Nov. 10, 2020 for Chinese Application No. 201780005371.0; 20 pages.
Intention to Grant dated Jul. 21, 2020 for European Application No. 17703911.2; 7 Pages.
Response (with English Remarks) to Chinese Office Action dated Nov. 10, 2020 for Chinese Application No. 201780005371.0; Response filed on Mar. 22, 2021; 12 pages.
Response (with English Translation) to Chinese Office Action dated Nov. 10, 2020 for Chinese Application No. 201780005371.0; Response filed on May 11, 2021; 7 pages.
Chinese Notice of Granting Patent Right for Invention (with English Translation) dated May 28, 2021 for Chinese Application No. 201780005371.0; 11 Pages.

* cited by examiner

APPARATUS AND METHOD FOR MULTI-CODE DISTRIBUTED STORAGE

CROSS REFERENCE TO RELATED APPLICATIONS

This application is a U.S. National Stage of PCT application PCT/US2017/015302 filed in the English language on Jan. 27, 2017, and entitled "APPARATUS AND METHOD FOR MULTI-CODE DISTRIBUTED STORAGE," which claims the benefit under 35 U.S.C. § 119 of provisional application No. 62/288,791 filed Jan. 29, 2016, which application is hereby incorporated herein by reference.

STATEMENT REGARDING FEDERALLY SPONSORED RESEARCH

This invention was made with Government support under Grant No. CCF1409228 awarded by the National Science Foundation. The Government has certain rights in the invention.

BACKGROUND

As is known in the art, distributed storage systems may require a certain degree of redundancy to overcome node failures, increase read bandwidth for highly requested content, etc. One solution is to store copies of the content on different nodes. Another to solution is to use Forward Error Correction (FEC) coding, which allows similar functionality but requires less storage overhead with the price of an increased complexity. Different FEC coding solutions have been proposed using Reed Solomon (RS) codes, Luby transform (LT) codes, low-density parity-check (LDPC) codes, or random linear network codes (RLNCs).

SUMMARY

It is appreciated herein that many existing storage clients (e.g., applications) could benefit from storing data in two or more distributed storage systems (e.g., cloud storage systems). For example, storage diversity may provide an additional layer of redundancy critical to high-availability applications. The multiplicity of available FEC codes may make it difficult or impossible for existing storage clients to utilize a diversity of distributed storage systems. The same challenge can appear when migrating data from one code to another code within the same distributed storage system. Currently, the only solution is a re-ingestion of the entire data. A more cost-effective solution would be retaining ingested data as they are and gradually transforming data to the new code.

The aforementioned scenarios require the capability that coded data of different FEC codes regardless of the implemented coding algorithm, finite field size, or selected source block size can be combined and jointly processed. However, there is a lack of holistic approaches for combining distinct FEC codes. Concerning finite field size, there are known techniques for transforming an RS code of a $\mathbb{F}_{2^q}$ finite field to its base field $\mathbb{F}_2$ (i.e., a binary base field), with the aim to avoid complex finite field multiplication operations or how to combine the elements of distinct finite fields. However, existing techniques do not allow combining equations systems on which codes rely.

Described herein are systems and techniques for combining coded data of multiple different codes. The systems and techniques described herein allow combining codes that use different coding algorithms, finite fields, and/or source block sizes. The techniques can be applied to any linear codes, including but not limited to RS and RLNC.

The techniques described herein can be used to improve existing distributed storage systems by allowing gradual data migration. The techniques can further be used within existing storage clients to allow application data to be stored within diverse different distributed storage systems.

According to one aspect of the disclosure, a method for use in a multi-code storage system includes: receiving first symbols associated with a file; receiving second symbols associated with the file, wherein either the first or second symbols are coded symbols encoded using a linear code; and jointly decoding the first and second symbols to recover the file.

In certain embodiments, receiving the first symbols comprises receiving the first symbols from a first distributed storage system; and receiving the second symbols comprises receiving the second symbols from a second distributed storage system. In other embodiments, receiving the first symbols and receiving the second symbols comprise receiving the first and second symbols from the same distributed storage system.

In some embodiments, receiving the first symbols includes receiving first coded symbols encoded using a first linear code; receiving the second symbols includes receiving second coded symbols encoded using a second linear code, wherein the first and second linear codes use different generator matrices, different finite fields, or different block sizes; and jointly decoding the first and second symbols includes jointly decoding the first and second coded symbols.

In certain embodiments, jointly decoding the first and second coded symbols to recover the file comprises: constructing a joint generator matrix based on the generator matrix used by the first code and the generator matrix used by the second code; and using the joint generator matrix, the first coded symbols, and the second coded symbols to recover the file.

In particular embodiments, wherein the first linear code using a first generator matrix and the second linear code use second different generator matrix, jointly decoding the first and second coded symbols to recover the file comprises: extracting submatrices from each of the first and second generator matrices; combining the extracted submatrices, one or more of the first coded symbols, and one or more of the second coded symbols; and recovering the file using the combination of the extracted submatrices, the one or more of the first coded symbols, and the one or more of the second coded symbols.

In some embodiments, the first linear coded uses a first finite field and the second linear code use a second different finite field, and jointly decoding the first and second coded symbols to recover the file comprises: mapping the first and second coded symbols to a common sub-field; deriving a mapping table for the first and second code symbols for mapping operations of the first and second finite fields to operations on the mapped first and second coded symbols based on field sizes of the first and second finite fields; and using the mapped first and second coded symbols and the mapping table to recover the file. In certain embodiments, each of the first and second linear codes uses a binary extension field and mapping the first and second coded symbols includes mapping the first and second coded fields to a common binary extension field.

In particular embodiments, wherein the first and second linear codes use different block sizes, jointly decoding the first and second coded symbols to recover the file comprises: extracting one or multiple submatrices from the generator matrix of the coded symbols of the smaller source block size depending on the number of coded symbols contained in the coded symbols of the larger source block size and extracting one or multiple submatrices from the generator matrix of the coded symbols of the larger source block size; concatenating the submatrices to a joint matrix; and using the joint matrix to recovering the file.

In many embodiments, the first and/or second symbols are coded symbols encoded using a Forward Error Correction (FEC) codes, a Random Linear Network code (RLNC), a Reed-Solomon (RS) code, a low-density parity-check (LDPC) code, and/or a Luby transform (LT) code.

According to another aspect of the disclosure, a system comprises one or more processors; a volatile memory; and a non-volatile memory storing computer program code that when executed on the processor causes execution across the one or more processors of a process operable to perform embodiments of the method described hereinabove.

According to yet another aspect of the disclosure, a computer program product tangibly embodied in a non-transitory computer-readable medium, the computer-readable medium storing program instructions that are executable to perform embodiments of the method described hereinabove.

BRIEF DESCRIPTION OF THE DRAWINGS

The foregoing features may be more fully understood from the following description of the drawings in which.

The drawings are not necessarily to scale, or inclusive of all elements of a system, emphasis instead generally being placed upon illustrating the concepts, structures, and techniques sought to be protected herein.

DETAILED DESCRIPTION

Before describing embodiments of the concepts, structures, and techniques sought to be protected herein, some terms are explained. As used herein, the term "multi-code" is used to describe systems and techniques wherein data may be stored using two different codes. As used herein, the term "storage device" refers to an apparatus having non-volatile memory and configured to store data thereon. Non-limiting examples of storage devices include disk drives, tape drives, flash memory, and other non-volatile memory (NVM) devices.

As used herein, the term "linear code" refers to a code in which the processing of the data on which the code operates can be expressed in terms of linear functions of that data over mathematical groups. In some embodiments, such groups are also fields.

As used herein, the terms "joint decoding" and "jointly decoding" refer to a process whereby two or more different sets of symbols are used to recover a file or other data, and whereby neither set of symbols on its own could be used to recover the data. In some embodiments, both sets of symbols may be encoded. In other embodiments, one of the sets of symbols may be unencoded.

Figure 1:
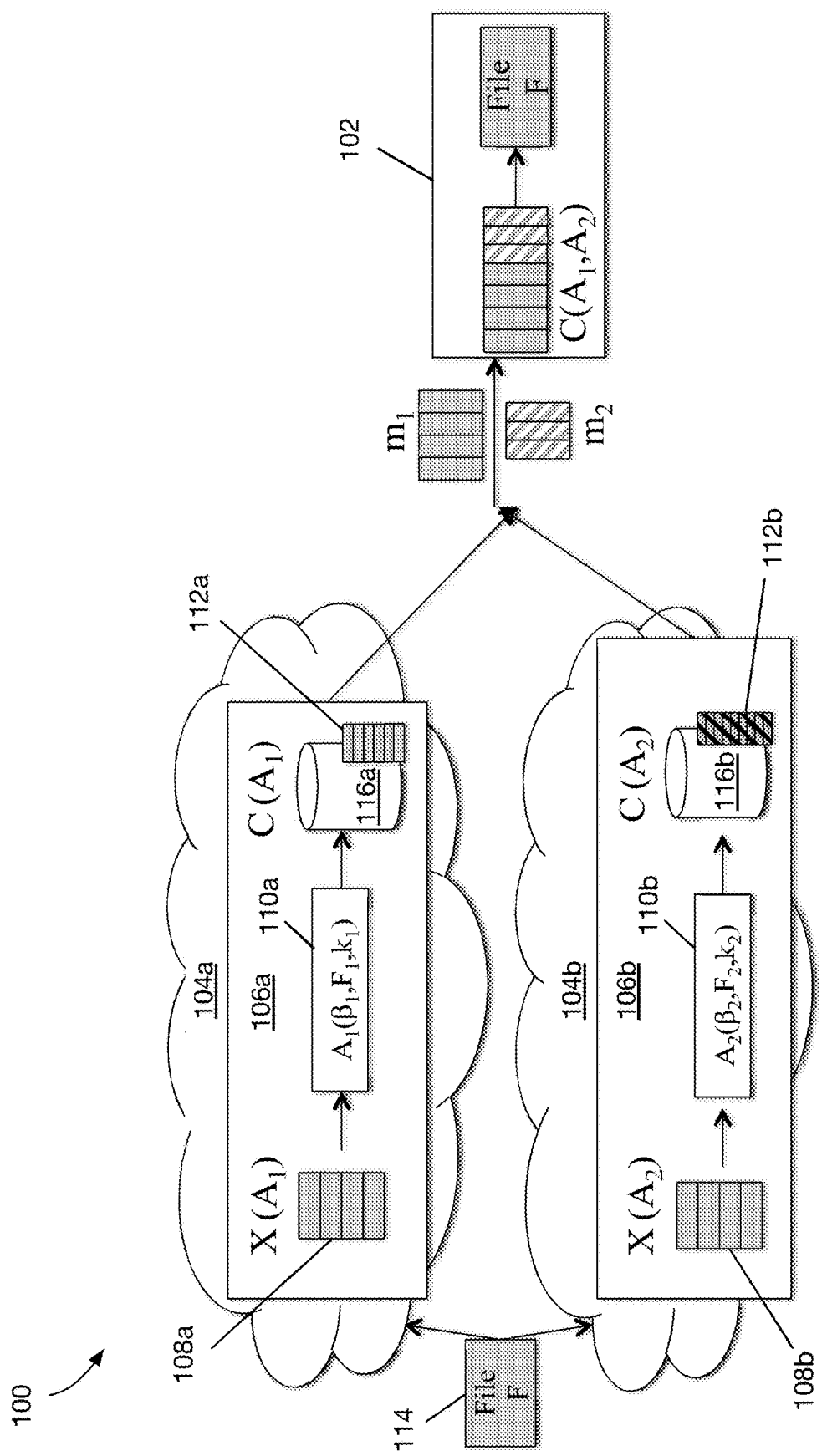
FIG. 1 is a system diagram illustrating a multi-code storage system, according to an embodiment of the disclosure.

Referring to FIG. 1, according to an embodiment of the disclosure, a multi-code storage system 100 includes a storage client 102 connected to a first storage system 104a and a second storage system 104a. The storage client (or simply "client") 102 may correspond to an application that utilizes data stored within the plurality of storage systems 104a, 104b (104 generally). In certain embodiments, the client 102 may also write data to one or more of the storage systems 104.

Each storage system 104 includes one or more storage nodes, and each storage node may include one or more storage devices. In the present embodiment, storage systems 104a and 104b each include one storage node 106a and 106b, respectively, and storage nodes 106a and 106b each include one storage device 116a and 116b, respectively. In some embodiments, a storage system 104 may be provided as a distributed storage system having many storage nodes 106 across which data may be stored. In particular embodiments, a storage system 104 may correspond to a cloud storage system.

Each of the storage systems 104a, 104b is configured to store data either in unencoded form or encoded form (e.g., using a FEC code). In the embodiment of FIG. 1, storage system 104a is configured encode data using a first code 110a, whereas storage system 104b is configured encode data using a second code 110b. In other embodiments, either storage system 104a or storage system 104b may store data in unencoded form.

In most embodiments, the codes 110a, 110b (110 generally) are linear codes. In various embodiments, one or both codes 110 may be forward error correction (FEC) codes. In many embodiments, a code 110 may be described by a function $A_x(G_x, \mathbb{F}_x, k_x)$, where $G_x$ corresponds to a generator matrix which is based on a selected coding algorithm, $\mathbb{F}_x$ corresponds to a finite field, and $k_x$ corresponds to a source block size (i.e., the number of source symbols per source block, where the size of a source symbol is determined by the size of an element of $\mathbb{F}_x$). In certain embodiments, the field $\mathbb{F}_x$ may be restricted to the binary base field $\mathbb{F}_x^2$ and its field extensions $\mathbb{F}_x^{2^q}$. It will be appreciated that many existing codes, such as FEC codes, utilize binary fields.

In certain embodiments, the first code 110a Reed-Solomon (RS) code and the second code 110b is a Random Linear Network code (RLNC). It is appreciated herein that this combination of codes has practical applications. For example, many legacy storage systems use RS codes, whereas next generation storage systems may use a RLNC. However, it should be understood that other codes can be used, for example LT-codes and LDPC codes.

Returning to the embodiment of FIG. 1, the first storage system 104a uses a first code 110a (herein denoted $A_1$) having generator matrix $G_1$, finite field $F_1$, and block size of $k_1$. The first storage system 104b uses a second code 110b (herein denoted $A_2$) having generator matrix $G_2$, finite field $F_2$, and block size of $k_2$.

A file 114 may be ingested and stored within each of the storage systems 108a, 108b. In particular, the file 114 may be ingested into storage system 108 by dividing the file 114 into a plurality of segments of $k_1$ source symbols denoted $X(A_1)$. The file segments $X(A_1)$ are input to the coding algorithm described by the generator matrix $G_1$, which maps $k_1$ source symbols to $n_1$ coded symbols $C(A_1)$. The coded symbols $C(A_1)$ are stored across one or more storage nodes and/or storage devices (e.g., storage device 116a) of the storage system 104a. The file 114 may be likewise ingested and stored within the second storage system 104b using the second code $A_2$ ($G_2$, $\mathbb{F}_2$, $k_2$).

In general, for a given code $A_x$, coded symbols $C(A_x)$ may be generated as:

$$C(A_x)=f(X(A_x),G_x)=X(k_x, \mathbb{F}_x) \cdot G_x,$$

which can also be described by a mapping:

$$C: \mathbb{F}^k \to \mathbb{F}^n.$$

In various embodiments, a code 110 may be a systematic code, where the first $k_x$ symbols of $C(A_x)$ are identical to the source symbols $X(A_x)$. Although systematic codes may reduce complexity, the systems and techniques sought to be protected herein do not rely on the use of systematic codes.

Returning to the embodiment of FIG. 1, as shown, the first and second codes 110a, 110b may be different codes. In particular embodiments, this means that at least one of the parameters $G_x$, $\mathbb{F}_x$, or $k_x$ is different between the first and second codes: i.e., $G_1 \neq G_2$, $\mathbb{F}_1 \neq \mathbb{F}_2$, and/or $k_1 \neq k_2$. Hence, the system 100 may be referred to as a multi-code storage system.

The client 102 may be configured to receive and decode data from any available storage node 106, regardless of the code 110 used by the corresponding storage system 104. For example, to retrieve file 114, the client may receive some of the coded symbols $C(A_1)$ from the first storage system 104a and some of the coded symbols $C(A_2)$ from the second storage system 104b.

In general, a client 102 may receive $m_x$ coded symbols from each of a plurality (n) of storage systems, for a total of $M=m_1+m_2 \ldots m_n$ coded symbols. The combination of received coded symbols is herein denoted $C(A_1, A_2, \ldots, A_n)$, where $A_1, A_2, \ldots, A_n$ correspond to the coding algorithms used by respective storage systems. N the case where a storage system 104 stores data in unencoded form, at least some of the symbols received by the client 104 may be unencoded.

It will be appreciated that the symbols received by the client 102 may include symbols coded using a single code or multiple different codes (e.g., codes 110a and 110b). In the former case, the client may decode the file 114 using conventional decoding techniques. In the later case, the client 102 may jointly decode the coded symbols $C(A_1, A_2, \ldots, A_n)$ use joint decoding concepts and techniques described herein below.

In order to decode the received coded symbols $C(A_1, A_2, \ldots, A_n)$, the client 102 may require knowledge of the coding parameters used by each of the storage systems 104. Such parameters may include, for each code, the generator matrix $G_x$, the finite field $\mathbb{F}_x$, and/or the source block size $k_x$. The client 102 may receive coding parameters from a storage system 106 using any suitable out-of-band or in-band technique.

Figure 2:
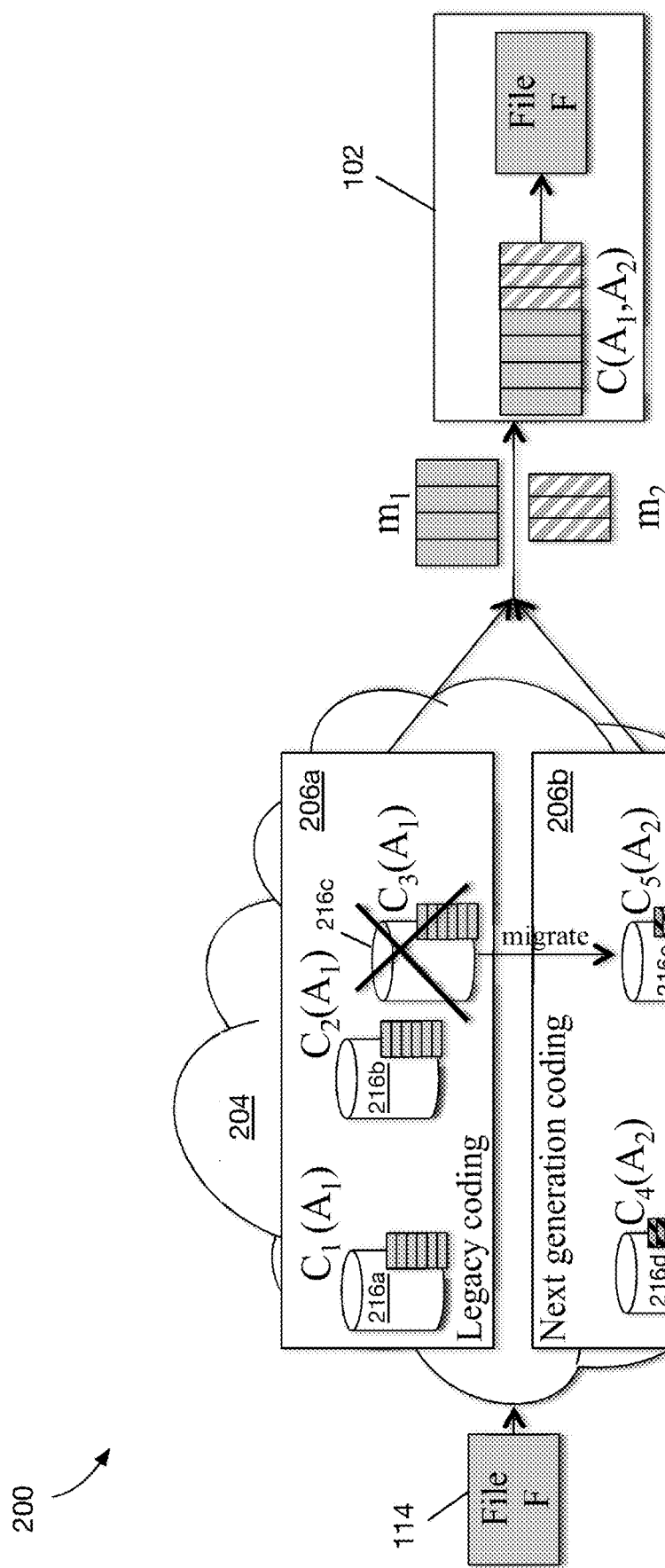
FIG. 2 is a system diagram illustrating a multi-code storage system, according to another embodiment of the disclosure.

Referring to FIG. 2, in which like elements of FIG. 1 are showing using like reference designators, a multi-code storage system 200 includes the storage client 102 and one distributed storage system 204, according to another embodiment of the disclosure. The distributed storage system 204 includes a plurality of storage nodes 206a, 206b (206 generally). In the example shown, a first storage node 206a includes storage devices 216a-216c and a second storage node 206b includes storage devices 216d, 216e. A first storage node 206a uses a first code $A_1$ and a second storage node 206b uses a second code $A_2$ different from the first code.

The embodiment of FIG. 2 may represent a situation where data stored using a legacy FEC code $A_1$ is gradually migrated to a next generation FEC code $A_2$. In particular, a file 114 may be ingested into first storage node 206a using code $A_1$ and stored as coded symbols across multiple network entities. In the example shown, the file 114 is stored across storage devices 216a, 216b, and 216c using the first code $A_1$ as coded symbols $C_1(A_1)$, $C_2(A_1)$, and $C_3(A_1)$, respectively. Subsequently, it may be necessary or desirable to migrate some of the coded data to a different network entity. For example, it may be necessary to migrate data in response to a node outage or disk failure. In the example shown in FIG. 2, in response to storage device 216c failing, some or all of the coded file data that was stored thereon using the first code $A_1$ (e.g., coded symbols $C_3(A_1)$), may be migrated to storage device 216e using the second code $A_2$(e.g., as coded symbols $C_5(A_2)$).

When retrieving the file from the storage system 204, a client (or "receiver") 102 can receive coded symbols from the two different codes $A_1$ and $A_2$, which can be indicated by in-band or out-of-band metadata sent along with the coded data. The client 102 can use the joint decoding techniques described herein to recover the file.

Referring now to both FIG. 1 and FIG. 2, according to some embodiments of the disclosure, a multi-code storage system (e.g., system 100 of FIG. 1 and/or system 200 of FIG. 2) may utilize a Reed-Solomon (RS) code and a Random Linear Network Code (RLNC).

As is known in the art, an RS code is a maximum distance separable (MDS) code, which means that k source symbols can be reconstructed from any n coded symbols. In various embodiments, the coding process of a RS code can be described by a generator matrix G of size k×n, which gives the required structure to the code to guarantee that all columns of the matrix are linearly independent and thereby to achieve the MDS code behavior. This can, for example, be constructed by a transposed Vandermonde matrix:

$$G_{i,j}=\alpha_i^{j-1} \text{ with } 1 \leq i \leq k, 1 \leq j \leq n$$

where $\alpha$ is an element of $\mathbb{F}_{2^q}$.

The matrix G can be interpreted as a set of coefficient vectors $\beta$, where each coefficient vector represents one columns of the transposed matrix G. One way to decode an RS code is by solving the coding function $C(A_x)=X(k_x)G_x$, with $G_x$ containing the coefficient vectors of the received symbols $C(A_x)$.

As is also known in the art, with an RLNC code, each coded symbol of $C(A_x)$ can be generated by $$c_i = \sum_{j=1}^{k} \beta_j x_i$$

where the coding coefficient vector $\beta$ is randomly selected from the elements of the used finite field $\mathbb{F}_{2^q}$. The decoding probability of an RLNC code depends on the probability that the coefficients of code symbols differ, which is given by $$Pr(\beta_j = \beta) = \frac{1}{q} \; \forall \, \beta \in \mathbb{F}_{2^q}.$$

It is also known in the art that, when using random linear coding arguments, the expected number E[x] of received information symbols before k linearly independent combinations can be collected is given by $$E[x] = \sum_{i=1}^{k} \frac{1}{1-q^{-i}}$$

which can be upper bounded by $$E[x]=kq/(q-1).$$

An RLNC code may be decoded (and encoded) by solving the function C $(A_x)=X(k_x)G_x$, with $G_x$ corresponding to the concatenation of the coding coefficients β.

As discussed above in conjunction with FIG. 1, in many embodiments, a multi-code storage system may utilize two distinct codes $A_1(G_1, \mathbb{F}_1, k_1)$ and $A_2(G_2, \mathbb{F}_2, k_2)$, where the codes differ in one or more of their respective parameters (i.e., $G_1 \neq G_2$, $F_1 \neq F_2$, and/or $k_1 \neq k_2$). Techniques for jointly decoding coded symbols $C(A_1, A_2)$ in each of the three cases are described next. It should be understood that each of the three techniques described below may be used separately or in combination with one or more of the other techniques (i.e., in the case where multiple coding parameters are different).

In the case where the two codes use different coding algorithms $G_1 \neq G_2$, the two codes may be described as $A_1(G_1, \mathbb{F}_1, k_1)$ and $A_2(G_2, \mathbb{F}_1, k_1)$. Here, a storage client (e.g., client 102 in FIG. 1) may jointly decode $M=m_1+m_2$ received symbols from the combined code $C(A_1, A_2)$ using a joint generator matrix $G_{k \times M}^{G_1 \neq G_2}$ constructed as follows:

$$G_{k \times M}^{G_1 \neq G_2} = [G_{1[1:m_1]} G_{2[1:m_2]}],$$

where $k=k_1$.

The related equation C $(A_1, A_2)=X(k) \cdot G_{k \times M}^{G_1 \neq G_2}$ can be solved if there are at least k linearly independent columns (i.e., coefficients) in $G_{k \times M}^{G_1 \neq G_2}$.

Figure 3:
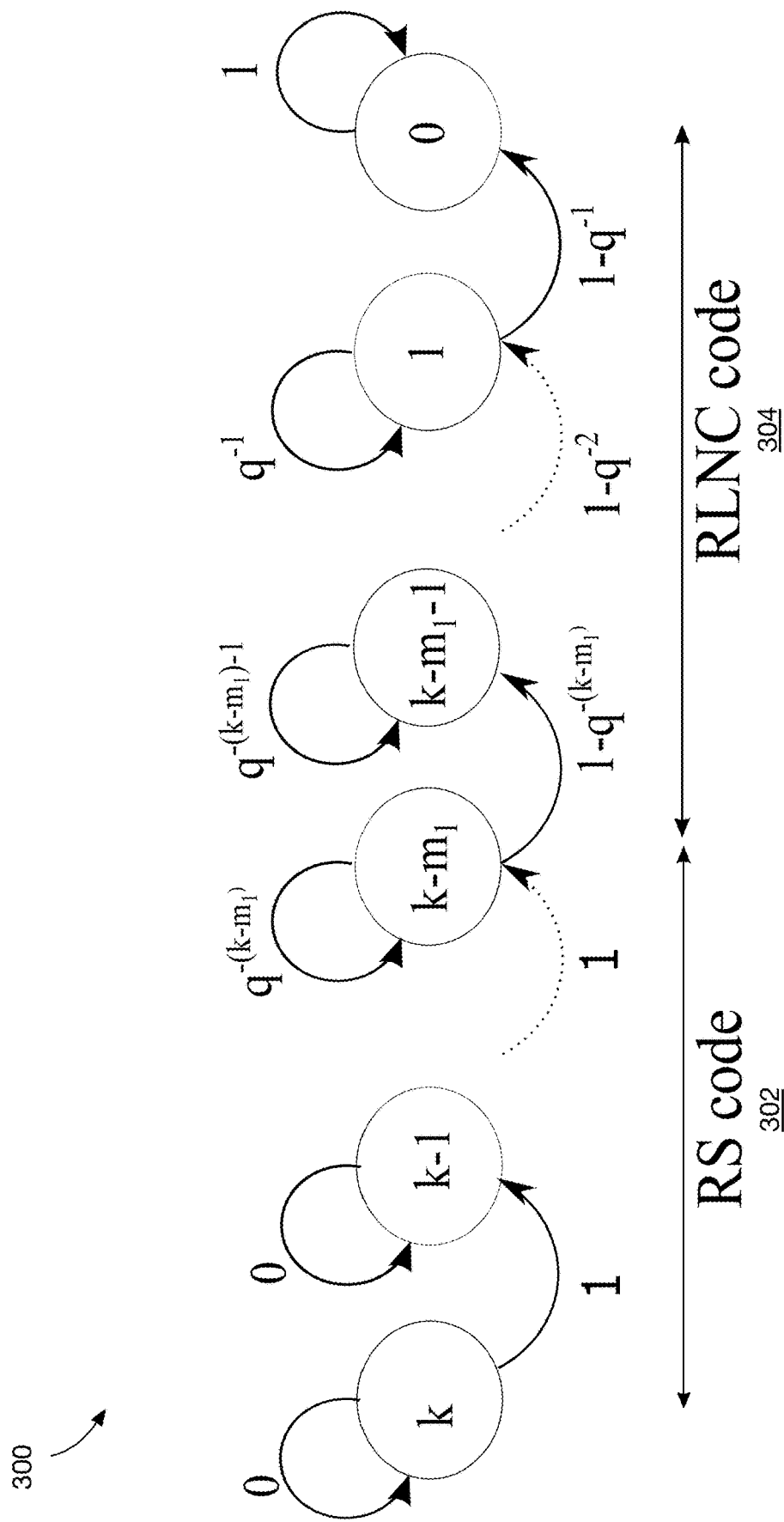
FIG. 3 is a diagram illustrating a joint decoding process, according to some embodiments.

Referring to FIG. 3, according to some embodiments, a joint decoding process can be described using a Markov chain 300. In the embodiment shown, the Markov chain may describe jointly decoding coded symbols from an RS code 302 and an RLNC code 304 (i.e., $G_1$ may be generated by an RS code 302 and $G_2$ by an RLNC code 304). In this case, the transition probabilities between received packets depends on the probability of a received coded packet being linearly independent. Thus, the symbols of the RS code 302 can be treated as random symbols of the RLNC code 304 that happen to be identical to the RS structure. Owning to the characteristic of the RS code 302 as an MDS code, the transition probabilities between the $m_1$ states of the RS code symbols (i.e., the states labeled "k" to "k-1" in FIG. 3) are equal to one (1), whereas the transition probability of the RLNC code states (e.g., the states labeled "k-$m_1$" to "k-$m_1$-1," "1," and "0" in FIG. 3) depends on the given finite field $\mathbb{F}_1$.

The Markov chain 300 can be used to derive bounds for the number of coded packets that need to be received before successfully decoding, where packets are ordered subsets of data, possibly already processed by codes. Compared to existing RLNC decoding techniques, the lower bound does not change with the combined code $C(A_1, A_2)$ since successful decoding of the combined code still requires at least the reception of k packets.

The upper bound for the number of coded packets that need to be received before successfully decoding depends on the selected field size $\mathbb{F}_{2^q}$. If the same k packets are encoded with an RS code 302 and an RLNC code 304 using the same field size q and the same finite field $\mathbb{F}_{2^q}$, then the mean number of coded packets that have to be received from both the RS code $m_1$ and the RLNC code $m_2$ before completely decoding of the original k packets is upper bounded by $$\min\left(m_1 + (k-m_1)\frac{q}{q-1}, k + \frac{1-q^{-(k-m_1)}}{q-q^{-1}}\right),$$

a proof of which follows.

From the Markov chain 300, it can be seen that the upper bounds of the combined code depend on the number of received RS and RLNC packets, $m_1$ and $m_2$ with $M=m_1+m_2$ and the transition probability between the different states $p_{i \to i+1}$ and $p_{j \to j+1}$. The expected minimum number of received packets $E[N_c]$ can be derived as $$E[N_c] = \sum_{i=1}^{m_1} \frac{1}{p_{i \to i+1}} + \sum_{j=1}^{k-m_1} \frac{1}{p_{j \to j+1}}$$

$$= m_1 + \sum_{j=1}^{k-m_1} \frac{1}{1-q^{-j}}$$

Since $q^{-j} \leq q$ for $q \geq 2$ and $j \geq 1$, then $$E[N_c] \leq m_1 + \sum_{j=1}^{k-m_1} \frac{q}{q-1} = m_1 + (k-m_1)\frac{q}{q-1}$$

which shows the first bound.

For the second upper bound, the expected minimum number of received packets $E[N_c]$ can reformulated as $$E[N_c] = m_1 + \sum_{j=1}^{k-m_1} 1 + \frac{1}{q^{j-1}}$$

$$= m_1 + (k-m_1) + \frac{1-q^{-(k-m_1)}}{q-q^{-1}} = k + \frac{1-q^{-(k-m_1)}}{1-q^{-1}}$$

which shows the second bound.

In the case where the two codes use different field sizes (i.e., $\mathbb{F}_1 \neq \mathbb{F}_2$), the two codes may be described as $A_1(G_1, \mathbb{F}_1, k_1)$ and $A_2(G_1, \mathbb{F}_2, k_1)$. In this case, the storage client may jointly decode $M=m_1+m_2$ received symbols from code $C(A_1, A_2)$ using a joint generator matrix $G_{k \times M}^{\mathbb{F}_1 \neq \mathbb{F}_2}$ constructed as follows:

$$G_{k \times M}^{\mathbb{F}_1 \neq \mathbb{F}_2} = [G_{1[1:m_1]} G_{2[1:m_2]}],$$

where $k=k_1$.

Solving the related equation $C(A_1, A_2)=X(k) \cdot G_{k \times M}^{\mathbb{F}_1 \neq \mathbb{F}_2}$ on the client side (e.g., within client 102) can be achieved by mapping the equation systems of $C(A_1)$ and $C(A_2)$ to a common sub-field. As shown in the following, any linear equation system Ax=y over extension field $\mathbb{F}_{2^q}$ can be mapped to its base field $\mathbb{F}_2$ and in that way $C(A_1, A_2)$ can be decoded.

Let $X_{ext}$ be a n=q-bits large element of the extension field $\mathbb{F}_{2^q}$ with q>1, and let $X_{base}*X=\{X_1|X_2|\ldots|X_q\}$ be the binary vector over the base field $\mathbb{F}_2$ whose concatenation form the element $X_{ext}$ in $\mathbb{F}_{2^q}$. Further, let $T_{ext}^+$ be the addition table and $T_{ext}^\times$ be the multiplication table of the extension field $\mathbb{F}_{2^q}$ and $T_{base}^+$ and $T_{base}^\times$ be the corresponding tables of the base field $\mathbb{F}_2$. Furthermore, let $S_{ext}$ denote the set of the $2^q$ elements of $\mathbb{F}_{2^q}$ and $Y_{ext}$ be the entries of table $T_{ext}^\times$. Further still, let $S_{base}^*$ and $Y_{base}^*$ be their binary vector over the base field $\mathbb{F}_2$.

TABLE 1A shows $T_{ext}^+$ for $\mathbb{F}_2^2 = \mathbb{F}_4$ and the therein contained table of $T_{base}^+$ for its base field $\mathbb{F}_2^1 = \mathbb{F}_2$, whereas TABLE 1B shows $T_{ext}^\times$ and $T_{base}^\times$ for the same fields.

TABLE 1A

| | $\mathbb{F}_4 +$ | | | |
|---|---|---|---|---|
| $\mathbb{F}_2 +$ | 00 | 01 | 10 | 11 |
| 00 | 00 | 01 | 10 | 11 |
| 01 | 01 | 00 | 11 | 10 |
| 10 | 10 | 11 | 00 | 01 |
| 11 | 11 | 10 | 01 | 00 |

TABLE 1B

| | $\mathbb{F}4 \times$ | | | |
|---|---|---|---|---|
| $\mathbb{F}2 \times$ | 00 | 01 | 10 | 11 |
| 00 | 00 | 00 | 00 | 00 |
| 01 | 00 | 01 | 10 | 11 |
| 10 | 00 | 10 | 11 | 01 |
| 11 | 00 | 11 | 01 | 10 |

Mapping the equation systems to their base fields is possible if a general mapping for the elements can be found, along with the multiplication and addition tables of the extension field to the tables of the base field: i.e. $T_{ext}^+ \to T_{base}^+$ and $T_{ext}^\times \to T_{base}^\times$.

For $T_{ext}^+ \to T_{base}^+$, it is appreciated herein that any operation in $T_{ext}^+$ on all elements $X \in S_{ext}$ is analogue to a bitwise XOR of the elements of $X_{base}^*$. Taking the illustrative field tables from TABLE 1A with q=2, the set of elements of the field are $A_{\mathbb{F}^4} = \{00, 01, 10, 11\}$, which can be mapped to the elements of the base field by $A_{base}^* = \{[0|0], [0|1], [1|0], [1|1]\}$ and it can be seen that an bitwise XOR in $\mathbb{F}_2$ leads to the same results as operations in $\mathbb{F}_4$ for all elements $X \in S$.

For $T_{ext}^\times \to T_{base}^\times$, it is necessary to find a mapping that allows for performing, for each operation and element in $T_{ext}^\times$, a mapping to operations in $\mathbb{F}_4$. To find this mapping, a mapping coefficient $\gamma$ may be introduced as an element of the target finite field $\mathbb{F}_2$. The possible operations in $\mathbb{F}_{2^q}$ are $\gamma_{ext} = \gamma_{ext} = Y_{ext}$, where $\gamma_{ext}$ can be any element in $S_{ext}$ also shown as row element in $T_{ext}^\times$. An unknown is $X_{ext}$, which is an arbitrary element in $S_{ext}$. Thus, $Y_{ext}$ is the result of the above multiplication, which produces the entries of $T_{ext}^\times$. The unknown $X_{ext}$ can be expressed as the vector $X_{base}^*$ as can $Y_{ext}$ be expressed as $Y_{base}^*$. The mapping from $\mathbb{F}_{2^q}$ to $\mathbb{F}_2$ may therefore involve include finding a suitable $Y_{base}$ to satisfy $\gamma_{i,1,1}*x_1+\gamma_{i,1,2}*x_2=y_{i,1}$ and $\gamma_{i,2,1}*x_1+\gamma_{i,2,2}*x_2=y_{i,2}$ for all $i \in \{0, \ldots, |A|-1\}$ or for each row in $T_{ext}^\times$ for any $X \in A_{ext}$. This can be expressed using the coefficient matrix $\Gamma$ by $\Gamma X = Y$.

For $T_{\mathbb{F}^4}^\times \to T_{\mathbb{F}^2}^\times$, the coefficient matrix is $\Gamma = \{[0,0], [0,0], [1,0], [0,1], [1,1], [1,0], [0,1], [1,1]\}$. The resulting F can be used to generate the mapping table $T_{\mathbb{F}^4}^\times \to T_{\mathbb{F}^2}^\times$, an example of which is shown in TABLE 2.

TABLE 2

| | $\mathbb{F}_2$ | | |
|---|---|---|---|
| $\mathbb{F}_4$ | $Y = [y_{i,1}$ | $y_{i,2}]$ | i |
| 00*X | $0x_1 + 0x_2$ | $0x_1 + 0x_2$ | 1 |
| 01*X | $1x_1 + 0x_2$ | $0x_1 + 1x_2$ | 2 |
| 10*X | $1x_1 + 1x_2$ | $1x_1 + 0x_2$ | 3 |
| 11*X | $0x_1 + 1x_2$ | $1x_1 + 1x_2$ | 4 |

In the case where the two codes use different source block sizes (i.e., $k_1 \neq k_2$), the two codes may be described as $A_1(G_1, \mathbb{F}_1, k_1)$ and $A_2(G_1, \mathbb{F}_1, k_2)$. Here, it can be assumed that there are two different sets of source symbols $X_1 \neq X_2$. The $A_1$ code is applied to $X_1$ and $X_2$ independently, generating two different repair blocks, each of them over $k_1$ source symbols. The $A_2$ code encodes $X = X_1 + X_2$ in a joint source block over $k_2$ source symbols.

A storage client may jointly decode $M = m_1 + m_2$ received symbols from code $C(A_1, A_2)$ using a joint generator matrix $G_{k \times M}^{k_1 \neq k_2}$ constructed as follows:

$$G_{\Sigma k \times \Sigma m}^{k_1 \neq k_2} = \begin{bmatrix} G_1(X_1) & 0 & G_1(X_1, X_2) \\ 0 & G_1(X_2) & \end{bmatrix},$$

with $m_1$, $m_2$, and $m_3$ denoting the number of received symbols, respectively, in columns $G_1(X_1)$, $G_1(X_2)$, and $G_1(X_1, X_2)$. The number of symbols the client requests may be upper bounded by $m_1 \leq k_1$ and $m_2 \leq k_2$. The lower bound may be given by $k_1 + k_2$ since in any case the reception of at least this number of packets is required.

The related equation $C(A_1, A_2) = [X_1 | X_2] * G_{\Sigma k \times \Sigma m}^{k_1 \neq k_2}$ can be solved within the client if the concatenated matrix $G_{\Sigma k \times \Sigma m}^{k_1 \neq k_2}$ constitutes a full rank matrix.

The matrix $G_1(X_1, X_2)$ can be seen as concatenation of an upper part $G_1(X_1, X_2)^u$ and a lower part $G_1(X_1, X_2)^l$. The upper and lower parts can be used to form concatenations $G(X_1) = [G_1(X_1) G_1(X_1, X_2)^u]$ and $G(X_2) = [G_1(X_2) G_1(X_1, X_2)^l]$. If $G(X_1)$ and $G(X_2)$ are both full rank, the matrix $G_{\Sigma k \times \Sigma m}^{k_1 \neq k_2}$ can be decoded using techniques described above in conjunction with the case where two different coding algorithms are used (i.e., $G_1 \neq G_2$).

Thus, as described above, the expected number of coded packets $E[N_e]$ required for joint decoding may depend on the number of received packets $m_1$, $m_2$, and $m_3$ and the related coding algorithm. In embodiments where $G_1(X_1)$ and $G_1(X_2)$ are symbols of an RS code and where $G_1(X_1, X_2)$ are symbols of an RLNC code, the upper bounds on the number of required packets with $M = m_1 + m_2$ is $$\min\left(\hat{M} + (k - \hat{M})\frac{q}{q-1}, k + \frac{1 - q^{-(k-\hat{M})}}{q - q^{-1}}\right).$$

It should be understood that, although embodiments of the structures, concepts, and techniques sought to be protected herein may be described in the context of RS and RLNC codes, such structures, concepts, and techniques are not restricted to this particular combination of codes, but rather may be applied to any of linear codes. For example, the techniques described herein may be applied to various linear codes such as block codes, convolutional codes, and rateless codes.

Figure 4:
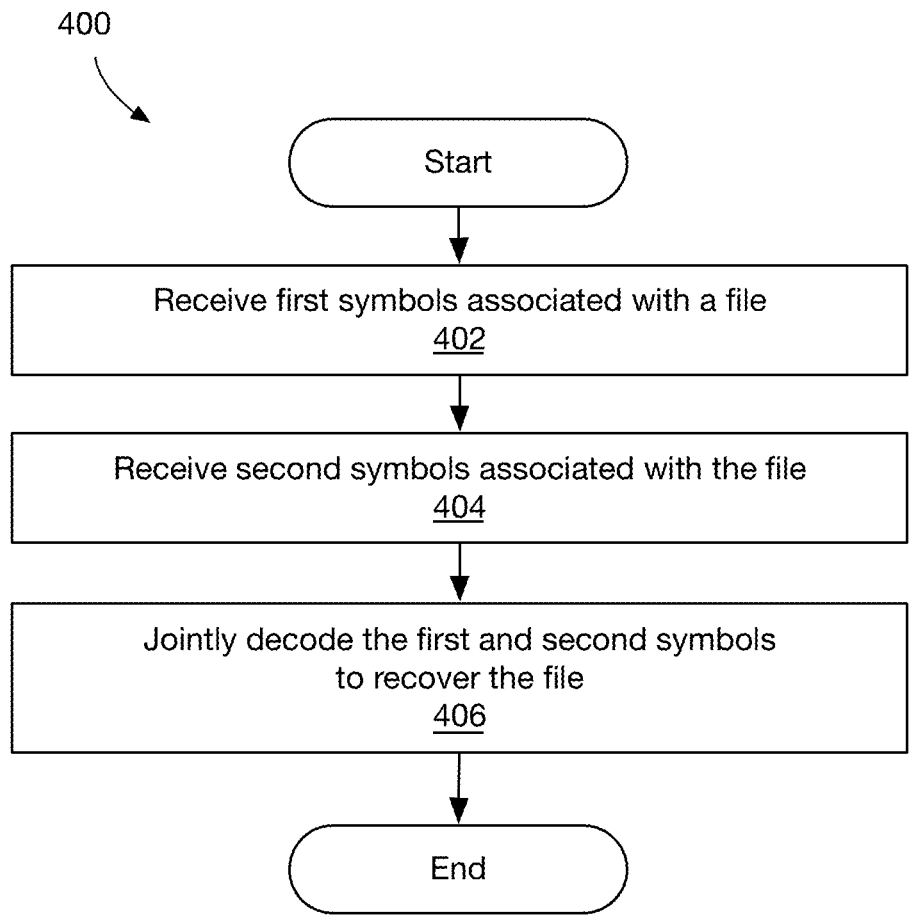
FIG. 4 is a flow diagram illustrating processing that may occur within a storage system node, in accordance with embodiments.

FIG. 4 is a flow diagram showing illustrative processing that can be implemented within a multi-code storage system (e.g., system of FIG. 1 and/or 200 of FIG. 2). In certain embodiments, the processing may be implemented within a storage client (e.g., client 102 in FIGS. 1 and 2). Rectangular elements (typified by element 402), herein denoted "processing blocks," represent computer software instructions or groups of instructions.

Alternatively, the processing blocks may represent steps performed by functionally equivalent circuits such as a digital signal processor (DSP) circuit or an application specific integrated circuit (ASIC). The flow diagrams do not depict the syntax of any particular programming language but rather illustrate the functional information one of ordinary skill in the art requires to fabricate circuits or to generate computer software to perform the processing required of the particular apparatus. It should be noted that many routine program elements, such as initialization of loops and variables and the use of temporary variables may be omitted for clarity. The particular sequence of blocks described is illustrative only and can be varied without departing from the spirit of the concepts, structures, and techniques sought to be protected herein. Thus, unless otherwise stated, the blocks described below are unordered meaning that, when possible, the functions represented by the blocks can be performed in any convenient or desirable order. In some embodiments, the processing blocks represent states and transitions, respectively, within a finite-state machine, which can be implemented in software and/or hardware.

Referring to FIG. 4, a method 400 begins at blocks 402 and 404, where a first set of symbols ("first symbols") associated with a file and second set of symbols ("second symbols") also associated with the file are received. Either the first or second symbols are coded symbols encoded using a linear code.

In some embodiments, the first symbols and the second symbols may be received from different distributed storage systems (e.g., different cloud storage systems.). In other embodiments, the first and second symbols may be received from the same distributed storage system (e.g., a system undergoing migration from a legacy code to a next generation code).

In some embodiments, the first symbols are encoded using a first linear code and second symbols are encoded using a second different linear code, wherein the first and second linear codes use different generator matrices, different finite fields, or different block sizes. In certain embodiments, the either the first or second symbols are coded symbols encoded using a Forward Error Correction (FEC) codes. In some embodiments, either the first or second symbols are coded symbols encoded using a Random Linear Network code (RLNC). In particular embodiments, either the first or second symbols are coded symbols encoded using a Reed-Solomon (RS) code. In certain embodiments, either the first or second symbols are coded symbols encoded using a low-density parity-check (LDPC) code. In some embodiments, either the first or second symbols are coded symbols encoded using a Luby transform (LT) code.

At block 406, the first and second coded symbols are jointly decoded recover a file. In some embodiments, jointly decoding the first and second coded symbols to recover the file comprises constructing a joint generator matrix based on the generator matrix used by the first code and the generator matrix used by the second code, and using the joint generator matrix, the first coded symbols, and the second coded symbols to recover the file.

In particular embodiments, where the first and second linear codes use different generator matrices, jointly decoding the first and second coded symbols to recover the file comprises: constructing a joint generator matrix based on the generator matrix used by the first code and the generator matrix used by the second code; and using the joint generator matrix, the first coded symbols, and the second coded symbols to recover the file.

In some embodiments, wherein the first and second linear codes use different finite fields, jointly decoding includes mapping the first and second coded symbols to a common sub-field; deriving a mapping table for the first and second code symbols for mapping operations of the first and second finite fields to operations on the mapped first and second coded symbols based on field sizes of the first and second finite fields; and using the mapped first and second coded symbols and the mapping table to recover the file. In some embodiments, each of the first and second linear codes uses a binary extension field, wherein mapping the first and second coded symbols includes mapping the first and second coded fields to a common binary extension field (e.g, $\mathbb{F}_{2^q}$).

In particular embodiments, wherein the first and second linear codes use different block sizes, jointly decoding may include: extracting one or multiple submatrices from the generator matrix of the coded symbols of the smaller source block size depending on the number of coded symbols contained in the coded symbols of the larger source block size and extracting one or multiple submatrices from the generator matrix of the coded symbols of the larger source block size; concatenating the submatrices to a joint matrix; and using the joint matrix to recovering the file. In certain embodiments, a number of extracted submatrices is determined such that both codes have a significant overlap in covered source symbols.

Figure 5:
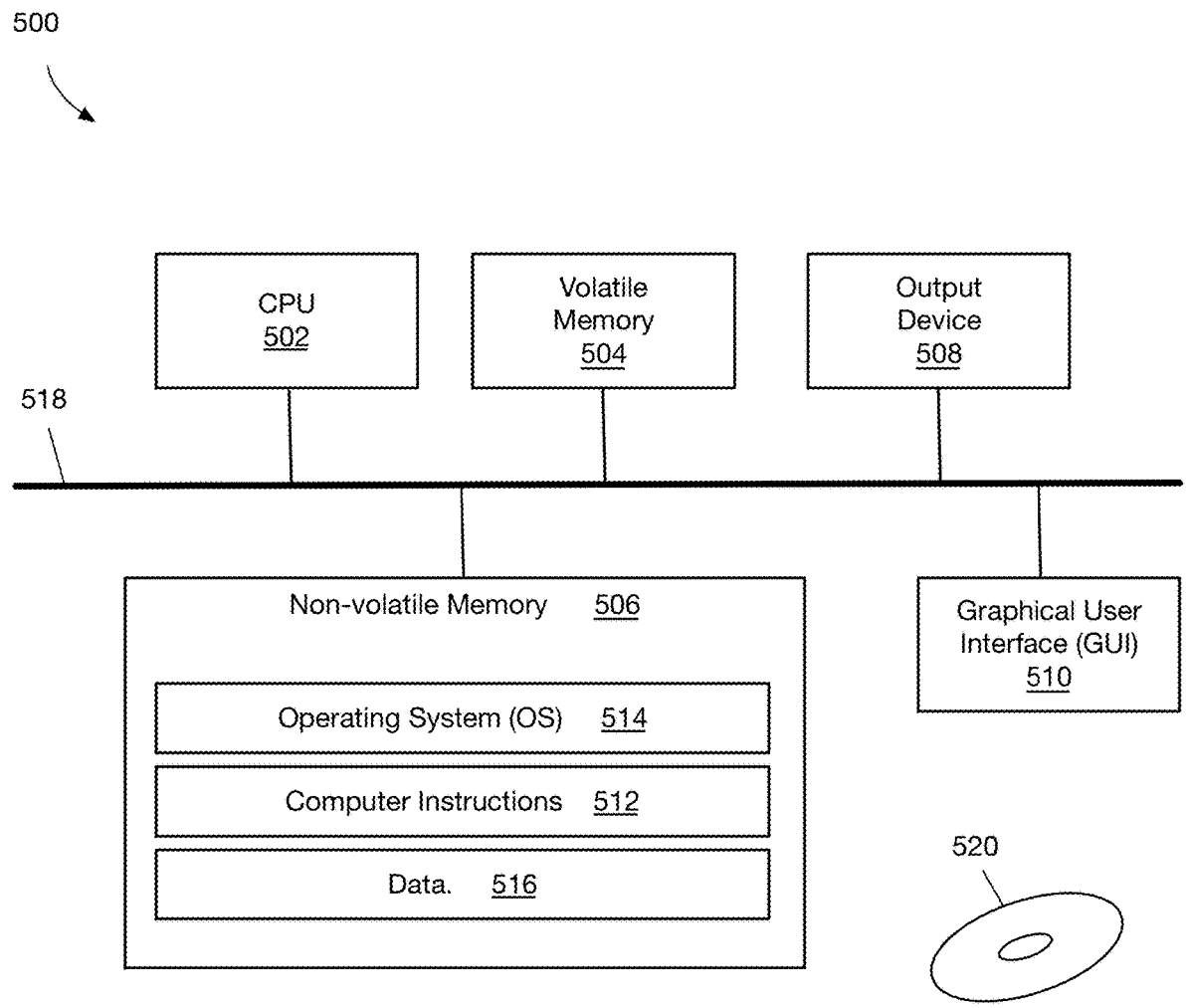
FIG. 5 is block diagram of a processing device on which the processing described herein may be implemented, according to an embodiment of the disclosure.

FIG. 5 shows an illustrative computer 500 that can perform at least part of the processing described herein, according to an embodiment of the disclosure. In some embodiments, the computer 500 may form a part of a multi-code storage system (e.g., system 100 of FIG. 1 and/or system 200 of FIG. 2).

The computer 500 may include a processor 502, a volatile memory 504, a non-volatile memory 506 (e.g., hard disk), an output device 508 and a graphical user interface (GUI) 510 (e.g., a mouse, a keyboard, a display, for example), each of which is coupled together by a bus 518. The non-volatile memory 506 may be configured to store computer instructions 512, an operating system 514, and data 516. In one example, the computer instructions 512 are executed by the processor 502 out of volatile memory 504. In some embodiments, the computer 500 corresponds to a virtual machine (VM). In other embodiments, the computer 500 corresponds to a physical computer.

In some embodiments, a non-transitory computer readable medium 520 may be provided on which a computer program product may be tangibly embodied. The non-transitory computer-readable medium 520 may store program instructions that are executable to perform processing described herein (e.g., the processing described above in conjunction with FIGS. 1-4).

Referring again to FIG. 5, processing may be implemented in hardware, software, or a combination of the two. In various embodiments, processing is provided by computer programs executing on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where, upon execution, instructions in the computer program cause the computer to operate. The program logic may be run on a physical or virtual processor. The program logic may be run across one or more physical or virtual processors.

Processing may be performed by one or more programmable processors executing one or more computer programs to perform the functions of the system. All or part of the system may be implemented as special purpose logic circuitry (e.g., an FPGA (field programmable gate array) and/or an ASIC (application-specific integrated circuit)).

Additionally, the software included as part of the concepts, structures, and techniques sought to be protected herein may be embodied in a computer program product that includes a computer-readable storage medium. For example, such a computer-readable storage medium can include a computer-readable memory device, such as a hard drive device, a CD-ROM, a DVD-ROM, or a computer diskette, having computer-readable program code segments stored thereon. In contrast, a computer-readable transmission medium can include a communications link, either optical, wired, or wireless, having program code segments carried thereon as digital or analog signals. A non-transitory machine-readable medium may include but is not limited to a hard drive, compact disc, flash memory, non-volatile memory, volatile memory, magnetic diskette and so forth but does not include a transitory signal per se.

All references cited herein are hereby incorporated herein by reference in their entirety.

Having described certain embodiments, which serve to illustrate various concepts, structures, and techniques sought to be protected herein, it will be apparent to those of ordinary skill in the art that other embodiments incorporating these concepts, structures, and techniques may be used. Elements of different embodiments described hereinabove may be combined to form other embodiments not specifically set forth above and, further, elements described in the context of a single embodiment may be provided separately or in any suitable sub-combination. Accordingly, it is submitted that the scope of protection sought herein should not be limited to the described embodiments but rather should be limited only by the spirit and scope of the following claims.

What is claimed is:

1. A method for use in a multi-code storage system, the method comprising:
   receiving, from a first distributed storage system, a first set of symbols corresponding to at least a portion of a file, wherein the first set of symbols comprises a first set of coded symbols encoded using a first set of source symbols and a first generator matrix;
   receiving, from a second distributed storage system, a second set of symbols corresponding to the at least the portion of the file, wherein the second set of symbols comprises a second set of coded symbols encoded using a second set of source symbols and a second generator matrix, with the first set of source symbols being different than the second set of source symbols; and
   during a decoding process to recover the file:
   receiving the first generator matrix from the first distributed storage system;
   receiving the second generator matrix from the second distributed storage system;
   constructing a generator matrix based on the first and second generator matrices; and
   jointly decoding the first and second sets of symbols using the constructed generator matrix to recover the file.

2. The method of claim 1 wherein the first distributed storage system and the second distributed storage system are the same distributed storage system.

3. The method of claim 1 wherein jointly decoding the first and second coded symbols to recover the file comprises:
   extracting submatrices from each of the first and second generator matrices;
   combining the extracted submatrices, one or more of the first coded symbols, and one or more of the second coded symbols; and
   recovering the file using the combination of the extracted submatrices, the one or more of the first coded symbols, and the one or more of the second coded symbols.

4. The method of claim 1 wherein the first code uses a first finite field and the second code use a second different finite field, wherein jointly decoding the first and second coded symbols to recover the file comprises:
   mapping the first and second coded symbols to a common sub-field;
   deriving a mapping table for the first and second coded symbols for mapping operations of the first and second finite fields to operations on the mapped first and second coded symbols based on field sizes of the first and second finite fields; and
   using the mapped first and second coded symbols and the mapping table to recover the file.

5. The method of claim 4 wherein each of the first and second codes uses a binary extension field, wherein mapping the first and second coded symbols includes mapping the first and second coded fields to a common binary extension field.

6. The method of claim 1 wherein the first and second codes use different block sizes, wherein jointly decoding the first and second coded symbols to recover the file comprises:
   extracting one or multiple submatrices from the generator matrix of the coded symbols of the smaller source block size depending on the number of coded symbols contained in the coded symbols of the larger source block size and extracting one or multiple submatrices from the generator matrix of the coded symbols of the larger source block size;

concatenating the submatrices to a joint matrix; and using the joint matrix to recover the file.

7. The method of claim 1 wherein either the first set or the second set of coded symbols are encoded using at least one of:
- a Forward Error Correction (FEC) code;
- a Random Linear Network code (RLNC);
- a Reed-Solomon (RS) code;
- a Low-Density Parity-Check (LDPC) code; or
- a Luby transform (LT) code.

8. A system comprising:
- a processor; and
- a non-volatile memory storing computer program code that when executed on the processor causes the processor to execute a process operable to:
  - receive, from a first distributed storage system, a first set of symbols corresponding to at least a portion of a file, wherein the first set of symbols comprises a first set of coded symbols encoded using a first set of source symbols and a first generator matrix;
  - receive, from a second distributed storage system, a second set of symbols corresponding to the at least the portion of the file, wherein the second set of symbols comprises a second set of coded symbols encoded using a second set of source symbols and a second generator matrix, with the first set of source symbols being different than the second set of source symbols; and
  - during a decoding process to recover the file:
    - receive the first generator matrix from the first distributed storage system;
    - receive the second generator matrix from the second distributed storage system;
    - construct a generator matrix based on the first and second generator matrices; and
    - jointly decode the first and second symbols using the constructed generator matrix to recover the file.

9. The method of claim 1 wherein either the first set or the second set of coded symbols are encoded using a linear code.

10. The method of claim 1 wherein the first and second set of source symbols differ in finite fields of source symbols or number k of source symbols, or a combination thereof.

11. The method of claim 1 wherein a size of the source symbols in the first and second set of source symbols is determined by the size of an element of a finite field.

12. The method of claim 1 wherein:
the first set of symbols is provided from a first finite field which operates on the first set of source symbols and the second set of symbols is provided from a second, different finite field which operates on the second set of source symbols.

13. The method of claim 1 wherein the method includes receiving more than two sets of symbols.

14. The method of claim 1 wherein the first and second distributed storage systems include a plurality of storage nodes.

15. The method of claim 1 wherein the first distributed storage system and the second distributed storage system are different distributed storage systems.

16. The system of claim 8 wherein the first distributed storage system and the second distributed storage system are the same distributed storage system.

* * * * *